(12) United States Patent
Shatalov et al.

(10) Patent No.: US 9,312,428 B2
(45) Date of Patent: Apr. 12, 2016

(54) LIGHT EMITTING HETEROSTRUCTURE WITH PARTIALLY RELAXED SEMICONDUCTOR LAYER

(71) Applicant: Sensor Electronic Technology, Inc., Columbia, SC (US)

(72) Inventors: Maxim S. Shatalov, Columbia, SC (US); Alexander Dobrinsky, Loudonville, NY (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 120 days.

(21) Appl. No.: 14/150,930

(22) Filed: Jan. 9, 2014

(65) Prior Publication Data

US 2014/0191261 A1    Jul. 10, 2014

Related U.S. Application Data

(60) Provisional application No. 61/750,432, filed on Jan. 9, 2013.

(51) Int. Cl.
| | | |
|---|---|---|
| H01L 33/00 | (2010.01) |
| H01L 33/02 | (2010.01) |
| H01L 33/14 | (2010.01) |
| H01L 33/12 | (2010.01) |
| H01S 5/02 | (2006.01) |
| H01S 5/323 | (2006.01) |

(52) U.S. Cl.
CPC .............. *H01L 33/007* (2013.01); *H01L 33/02* (2013.01); *H01L 33/14* (2013.01); *H01L 33/12* (2013.01); *H01S 5/021* (2013.01); *H01S 5/0213* (2013.01); *H01S 5/32341* (2013.01); *H01S 2301/173* (2013.01)

(58) Field of Classification Search
CPC ....... H01L 33/007; H01L 33/02; H01L 33/14; H01L 33/12; H01S 2301/173; H01S 5/021; H01S 5/0213; H01S 5/32341
See application file for complete search history.

(56) References Cited

U.S. PATENT DOCUMENTS

| | | |
|---|---|---|
| 5,306,924 A | 4/1994 | Usami et al. |
| 7,312,474 B2 | 12/2007 | Emerson et al. |
| 7,811,847 B2 | 10/2010 | Hirayama et al. |
| 7,888,154 B2 | 2/2011 | Hirayama et al. |

(Continued)

FOREIGN PATENT DOCUMENTS

| | | |
|---|---|---|
| JP | 2008091754 | 4/2008 |
| KR | 1020100010363 | 2/2012 |
| KR | 1020120111364 | * 10/2012 |

OTHER PUBLICATIONS

Nishinaga T, Nakano T, Zhang S, Epixtaxial Lateral Overgrowth of GaAs by LPE, (1988) Jpn. J. Appl. Phys 27, 1964.

(Continued)

*Primary Examiner* — Minh-Loan Tran
*Assistant Examiner* — Farid Khan
(74) *Attorney, Agent, or Firm* — LaBatt, LLC

(57) ABSTRACT

A light emitting heterostructure including a partially relaxed semiconductor layer is provided. The partially relaxed semiconductor layer can be included as a sublayer of a contact semiconductor layer of the light emitting heterostructure. A dislocation blocking structure also can be included adjacent to the partially relaxed semiconductor layer.

21 Claims, 15 Drawing Sheets

(56) References Cited

U.S. PATENT DOCUMENTS

| | | | |
|---|---|---|---|
| 8,080,833 B2 | 12/2011 | Grandusky et al. | |
| 2006/0160345 A1 | 7/2006 | Liu et al. | |
| 2007/0181869 A1* | 8/2007 | Gaska | H01L 33/06 257/14 |
| 2009/0239357 A1 | 9/2009 | Amano et al. | |
| 2010/0019258 A1 | 1/2010 | Kang et al. | |
| 2010/0264460 A1* | 10/2010 | Grandusky | H01L 21/02389 257/190 |
| 2011/0266520 A1* | 11/2011 | Shur | H01L 33/06 257/13 |
| 2011/0284890 A1* | 11/2011 | Kim | H01L 33/12 257/94 |
| 2013/0193480 A1 | 8/2013 | Sun et al. | |

OTHER PUBLICATIONS

Zhang JP, Wang HM, Gaevski ME, Chen CQ, Fareed Q, Yang JW, et al. Crack-free thick AlGaN grown on sapphire using AlN/AlGaN superlattices for strain management. Appl. Phys. Lett. 2002;80(19):3542.

Zhang J, Kuokstis E, Fareed Q, Wang H, Yang J, Simin G, et al. Pulsed atomic layer epitaxy of quaternary AlInGaN layers. Appl. Phys. Lett. 2001;79(7):925.

Haeberlen M, Zhu D, McAleese C, Kappers MJ, Humphreys CJ. Dislocation reduction in MOVPE grown GaN layers on (111)Si using SiNx and AlGaN layers. Journal of Physics: Conference Series. Feb. 1, 2010;209:012017.

Hideki Hirayama et al.; 231-261 nm AlGaN deep-ultraviolet light-emitting diodes fabricated on AlN multilayer buffers grown by ammonia pulse-flow method on sapphire; American Institute of Physics, Applied Physics Letters 91, 071901 (2007), pp. 1-3.

Hideki Hirayama, 2007 Research Performance Report, machine translation of http://kaken.nii.ac.jp/d/p/18069014/2007/3/ja.ja.html.

Yoshikawa, A., et al., "A New "Three-Step Method" for High Quality MOVPE Growth of III-Nitrides on Sapphire," Phys. Stat. Sol. (a) 188, No. 2, pp. 625-628, Jul. 12, 2001.

Morkoç H. Handbook of nitride semiconductors and devices, Materials Properties, Physics and Growth. Weinheim: Wiley-VCH; vol. 2, Table of Contents, 2008.

Acord J, Raghavan S, Snyder D, Redwing J. In situ stress measurements during MOCVD growth of AlGaN on SiC. Journal of Crystal Growth. Dec. 2004;272(1-4):65-71.

Bai J, Dudley M, Sun WH, Wang HM, Khan MA. Reduction of threading dislocation densities in AlN/sapphire epilayers driven by growth mode modification. Appl. Phys. Lett. 2006;88(5):051903.

Chen Z, Zhi-Biao H, Fan R, Jian-Nan H, Yi L. Improvement of AlN Film Quality by Controlling the Coalescence of Nucleation Islands in Plasma-Assisted Molecular Beam Epitaxy. Chinese Phys. Lett. May 2010;27(5):058101.

Dimitrakopulos GP, Kalesaki E, Komninou P, Kehagias T, Kioseoglou J, Karakostas T. Strain accommodation and interfacial structure of AlN interlayers in GaN. Cryst. Res. Technol. Oct. 2009;44(10):1170-1180.

Dridi Z, Bouhafs B, Ruterana P. First-principles investigation of lattice constants and bowing parameters in wurtzite $AlxGa(1-x)N$, $InxGa(1-x)N$ and $InxAl(1-x)N$ alloys. Semicond. Sci. Technol. Sep. 2003;18(9):850-856.

Figge S. In situ and ex situ evaluation of the film coalescence for GaN growth on GaN nucleation layers. Journal of Crystal Growth. Dec. 2000;221(1-4):262-266.

Hirayama H, Ohashi T, Kamata N. Optical semiconductor device and method for manufacturing the same. Oct. 12, 2010.

Hsu K-Y, Wang C-Y, Liu C-P. Growth and Characteristics of Self-Assembly Defect-Free GaN Surface Islands by Molecular Beam Epitaxy. J. Nanosci. Nanotech. Apr. 2011;11(4):3393-3398 (Abstract only).

Imura M, Nakano K, Fujimoto N, Okada N, Balakrishnan K, Iwaya M, et al. High-Temperature Metal-Organic Vapor Phase Epitaxial Growth of AlN on Sapphire by Multi Transition Growth Mode Method Varying V/III Ratio. Jpn. J. Appl. Phys. Nov. 2006;45(11):8639-8643.

Jie Z, Li-Wei G, Zhi-Gang X, Bing-Hui G, Guo-Jian D, Ming-Zeng P, et al. Growth of Highly Conductive n-Type Al 0.7 Ga 0.3 N Film by Using AlN Buffer with Periodical Variation of V/III Ratio. Chinese Phys. Lett. Dec. 2008;25 (12):4449-4452.

Mitrofanov O, Schmult S, Manfra MJ, Siegrist T, Weimann NG, Sergent AM, et al. High quality UV AlGaN/AlGaN distributed Bragg reflectors and microcavities [Internet]. In: Proceedings of SPIE. San Jose, CA, USA: 2007 [cited Nov. 22, 2011]. p. 64731G-64731G-5. Available from: http://link.aip.org/link/PSISDG/v6473/i1/p64731G/s1&Agg=doi.

Morkoç H. Handbook of nitride semiconductors and devices, Materials Properties, Physics and Growth. Weinheim: Wiley-VCH; vol. 3, Table of Contents for Chapters 1-4, 2008.

Ohba Y. Growth of AlN on sapphire substrates by using a thin AlN buffer layer grown two-dimensionally at a very low V/III ratio. Journal of Crystal Growth. Dec. 2000;221(1-4):258-261.

Okada N, Kato N, Sato S, Sumii T, Nagai T, Fujimoto N, et al. Growth of high-quality and crack free AlN layers on sapphire substrate by multi-growth mode modification. Journal of Crystal Growth. Jan. 2007;298:349-353.

Park, Search Report for PCTUS2014010770, May 8, 2014.

Ponchet A, Rocher A, Emery J-Y, Starck C, Goldstein L. Lateral modulations in zeronet-strained GaInAsP multilayers grown by gas source molecular-beam epitaxy. J. Appl. Phys. 1993;74(6):3778.

Reentila O, Brunner F, Knauer A, Mogilatenko A, Neumann W, Protzmann H, et al. Effect of the AlN nucleation layer growth on AlN material quality. Journal of Crystal Growth. Nov. 2008;310(23):4932-4934.

Sang LW, Qin ZX, Fang H, Dai T, Yang ZJ, Shen B, et al. Reduction in threading dislocation densities in AlN epilayer by introducing a pulsed atomic-layer epitaxial buffer layer. Appl. Phys. Lett. 2008;93(12):122104.

Yamaguchi S, Kariya M, Kosaki M, Yukawa Y, Nitta S, Amano H, et al. Control of strain in GaN by a combination of H [sub 2] and N[sub 2] carrier gases. J. Appl. Phys. 2001;89(12):7820.

Yamaguchi S, Kosaki M, Watanabe Y, Yukawa Y, Nitta S, Amano H, et al. Metalorganic vapor phase epitaxy growth of crack-free AlN on GaN and its application to high-mobility AlN/GaN supertattices. Appl. Phys. Lett. 2001;79(19):3062.

* cited by examiner

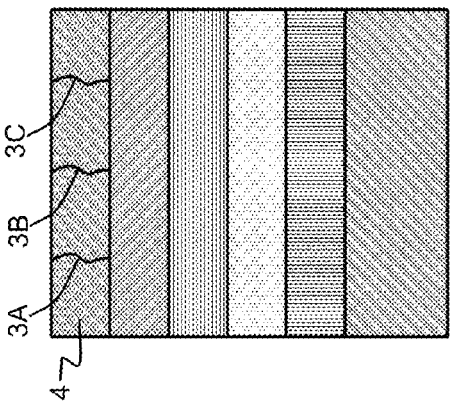
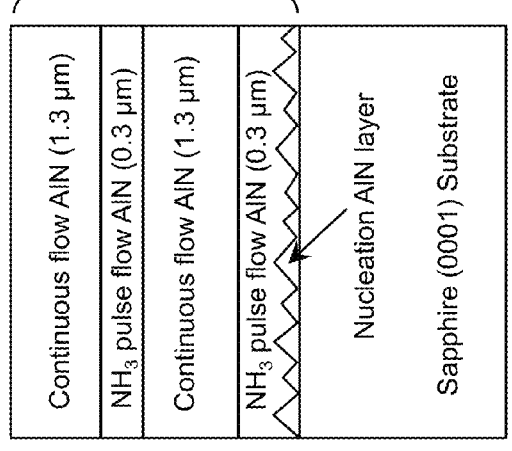
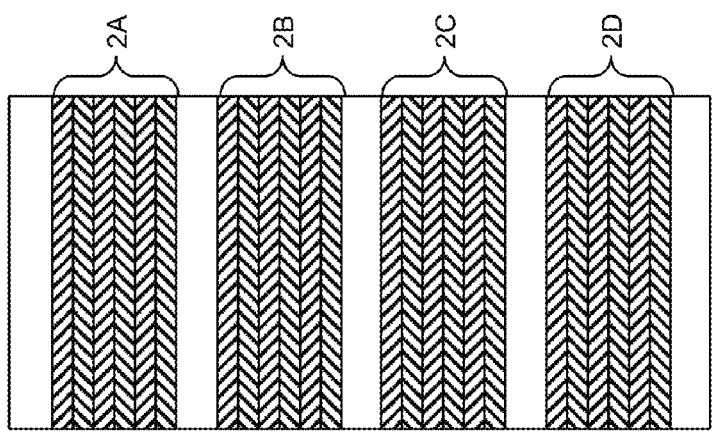
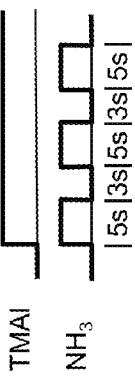
FIG. 1A
Prior Art
FIG. 1B
Prior Art
FIG. 1C
Prior Art
FIG. 1D
Prior Art

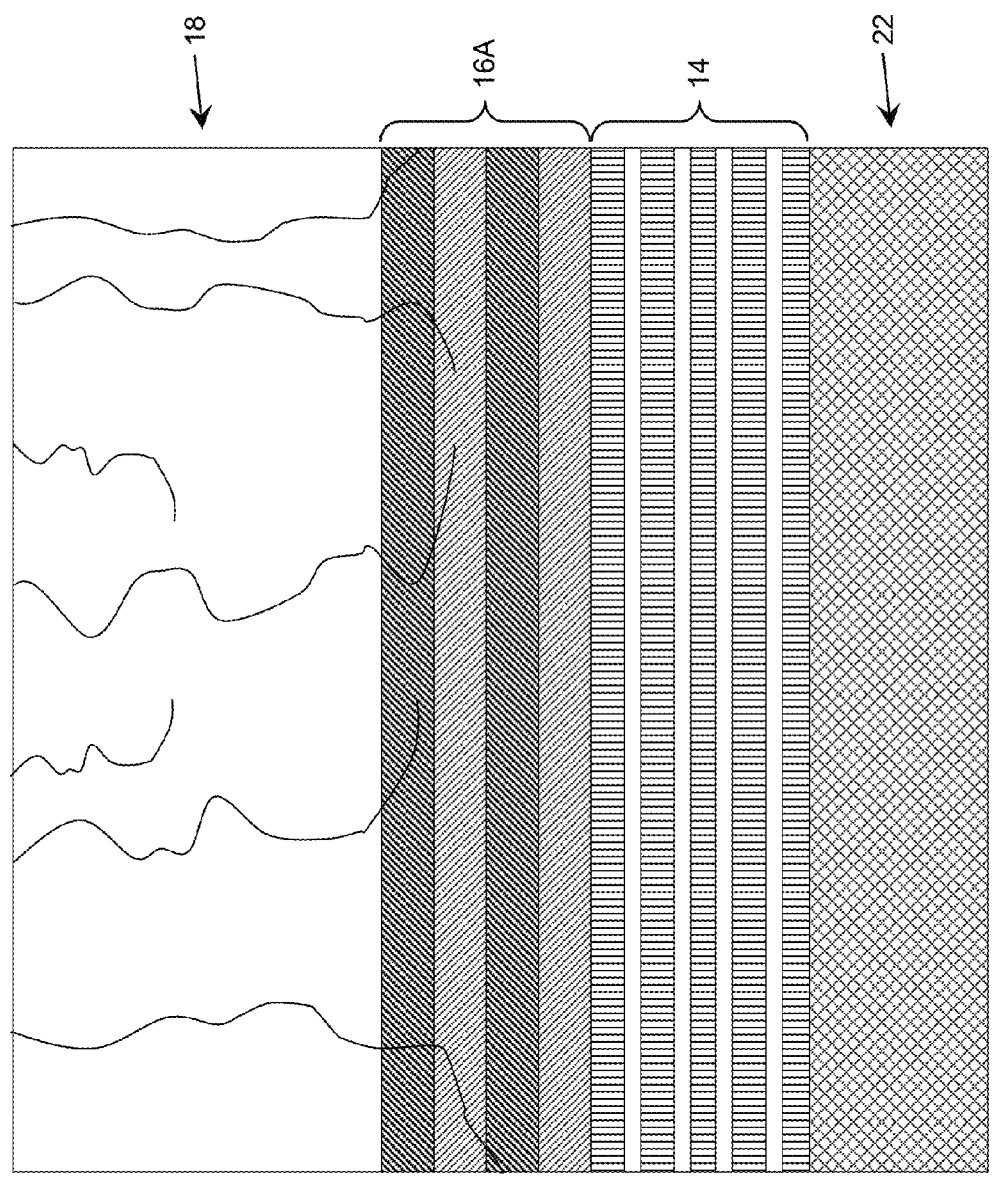

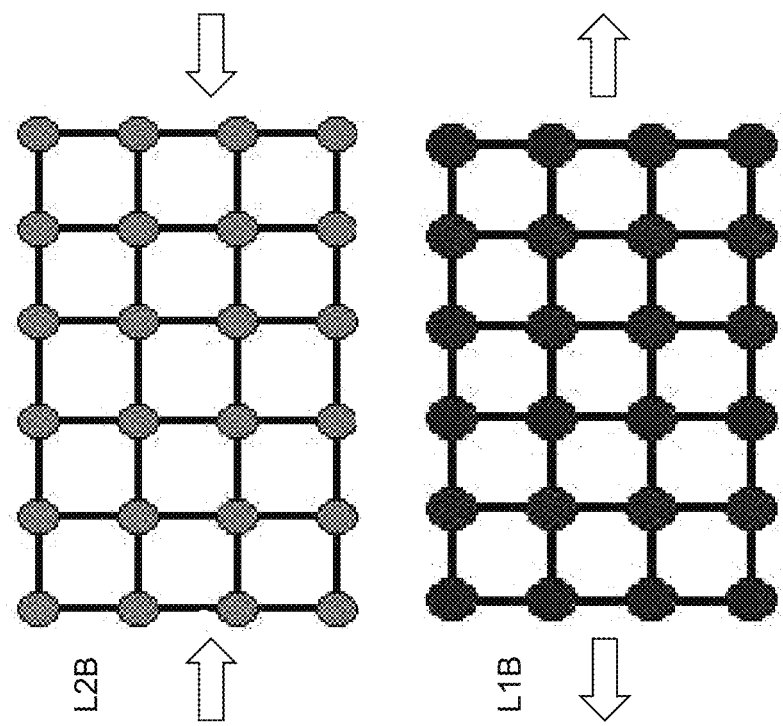
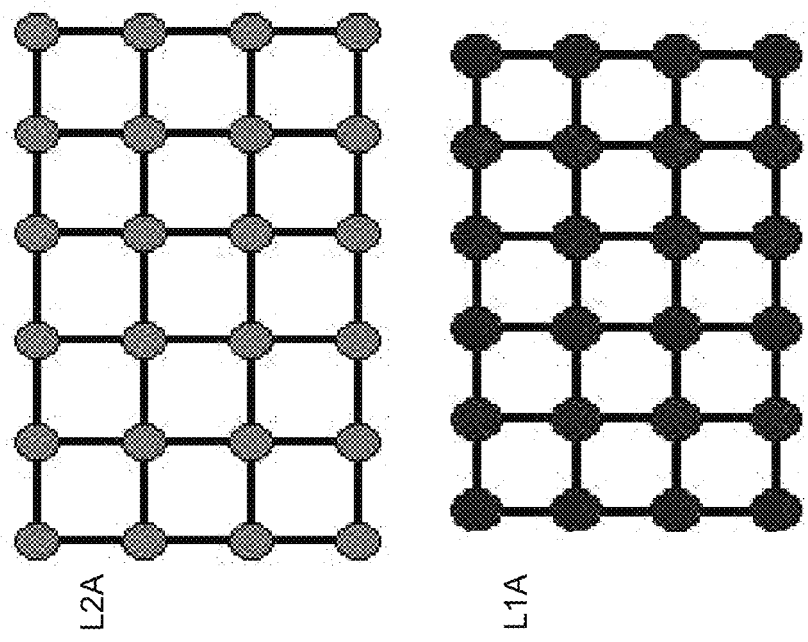

LIGHT EMITTING HETEROSTRUCTURE WITH PARTIALLY RELAXED SEMICONDUCTOR LAYER

REFERENCE TO RELATED APPLICATIONS

The current application claims the benefit of U.S. Provisional Application No. 61/750,432, titled "Light Emitting Heterostructure with Partially Relaxed Semiconductor Layer, and Dislocation Stoping Layer," which was filed on 9 Jan. 2013, and which is hereby incorporated by reference. Aspects of the invention are related to U.S. patent application Ser. No. 13/692,191, which was filed on 3 Dec. 2012, and which is hereby incorporated by reference.

TECHNICAL FIELD

The disclosure relates generally to light emitting heterostructures, and more particularly, to inclusion of one or more partially relaxed semiconductor layers in a light emitting heterostructure.

BACKGROUND ART

For light emitting devices, such as light emitting diodes (LEDs) and especially deep ultraviolet LEDs (DUV LEDs), minimizing a dislocation density and a number of cracks in the semiconductor layers increases the efficiency of the device. To this extent, several approaches have sought to grow low-defect semiconductor layers on patterned substrates. These approaches typically rely on reducing stresses present in epitaxially grown semiconductor layers.

For example, one approach to reduce stress accumulation in an epitaxially grown layer relies on patterning the underlying substrate using microchannel epitaxy (MCE). Using MCE, a narrow channel is used as a nucleation center containing low defect information from the substrate. An opening in a mask acts as a microchannel, which transfers crystal information to the overgrown layer, while the mask prevents dislocations from transferring to the overgrown layer.

Other approaches rely on epitaxially growing a group III nitride based semiconductor superlattice. The superlattice structure mitigates the strain difference between an aluminum nitride (AlN)/sapphire template and the subsequent thick $Al_xGa_{1-x}N$ (where $0 \leq x \leq 1$) layers. For devices such as DUV LEDs, thick AlGaN epitaxial layers (e.g., of the order of a few micrometers) are desirable to reduce current crowding. Using a superlattice approach, an AlN/AlGaN superlattice was grown to reduce biaxial tensile strain and a 3.0-μm-thick $Al_{0.2}Ga_{0.8}N$ was grown on sapphire without any cracks. Similarly, a superlattice structure shown in FIG. 1A can comprise a periodic structure with each element 2A-2D composed of alternating sublayers of semiconductor materials with different polarizations and different accumulated stresses in the sublayers. Such a superlattice can be used to minimize the dislocation density due to varying stresses in the sublayers of the superlattice elements.

While the superlattice approaches allow some control of tensile and compressive stresses in epitaxially grown nitride semiconductor layers, the approaches do not enable epitaxial growth of nitride based semiconductor layers with uniform composition. To grow such layers, variation of nitrogen and aluminum vacancies has been explored. For example, a migration enhanced metalorganic chemical vapor deposition epitaxial growth technique (with an $NH_3$ pulse-flow) can be used to grow high-quality AlN layers. Variation of growth modes can be used to reduce threading dislocations. Additionally, FIGS. 1B and 1C illustrate another approach for fabricating AlN multilayer buffers according to the prior art. In this case, a pulsing $NH_3$ gas flow rate is used to control crack propagation and threading dislocations in the semiconductor layers. FIG. 1B shows the gas flow sequence used for $NH_3$ pulse-flow growth, while FIG. 1C shows a schematic structure of the AlN buffer. In a first step, an AlN nucleation layer and an initial AlN layer are deposited using $NH_3$ pulse-flow growth. A low threading dislocation density was achieved by a coalescence process of the AlN nucleation layer. For example, as observed from a cross-sectional transmission electron microscope (TEM) image, edge-type and screw-type dislocation densities of an AlGaN layer on an AlN buffer layer were reported as $3.2 \times 10^9$ and $3.5 \times 10^8$ cm$^{-2}$, respectively.

In another approach disclosed in U.S. Pat. No. 8,080,833, relaxation of some semiconductor layers has been proposed. In particular, this approach seeks to relax the p-type contact layer due to a high GaN content, and therefore a high lattice mismatch. FIG. 1D shows the proposed schematics of the layer, where defects 3A-3C are shown within the relaxed p-type cap layer 4.

SUMMARY OF THE INVENTION

Aspects of the invention provide a light emitting heterostructure including a partially relaxed semiconductor layer. The partially relaxed semiconductor layer can be included as a sublayer of a contact semiconductor layer of the light emitting heterostructure. A dislocation blocking structure also can be included adjacent to the partially relaxed semiconductor layer. The heterostructure can result in fewer defects present in a light generating structure of the heterostructure.

A first aspect of the invention provides a heterostructure comprising: a light generating structure having a first side and a second side; a n-type contact semiconductor layer located on the first side of the light generating structure; and a p-type contact semiconductor layer located on the second side of the light generating structure, wherein at least one of the contact semiconductor layers includes an embedded partially relaxed sublayer.

A second aspect of the invention provides a device comprising: a mesa structure including: a light generating structure having a first side and a second side; a n-type contact semiconductor layer located on the first side of the light generating structure; and a p-type contact semiconductor layer located on the second side of the light generating structure, wherein at least one of the contact semiconductor layers includes an embedded partially relaxed sublayer.

A third aspect of the invention provides a method comprising: forming a heterostructure, the heterostructure comprising: a light generating structure having a first side and a second side; a n-type contact semiconductor layer located on the first side of the light generating structure; and a p-type contact semiconductor layer located on the second side of the light generating structure, wherein at least one of the contact semiconductor layers includes an embedded partially relaxed sublayer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 1A-1D show approaches for reducing dislocation density according to the prior art.

FIG. 8 shows a schematic illustration of the dislocation blocking according to an embodiment.

FIGS. 12A and 12B illustrate lattice mismatch between two lattices according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 2:
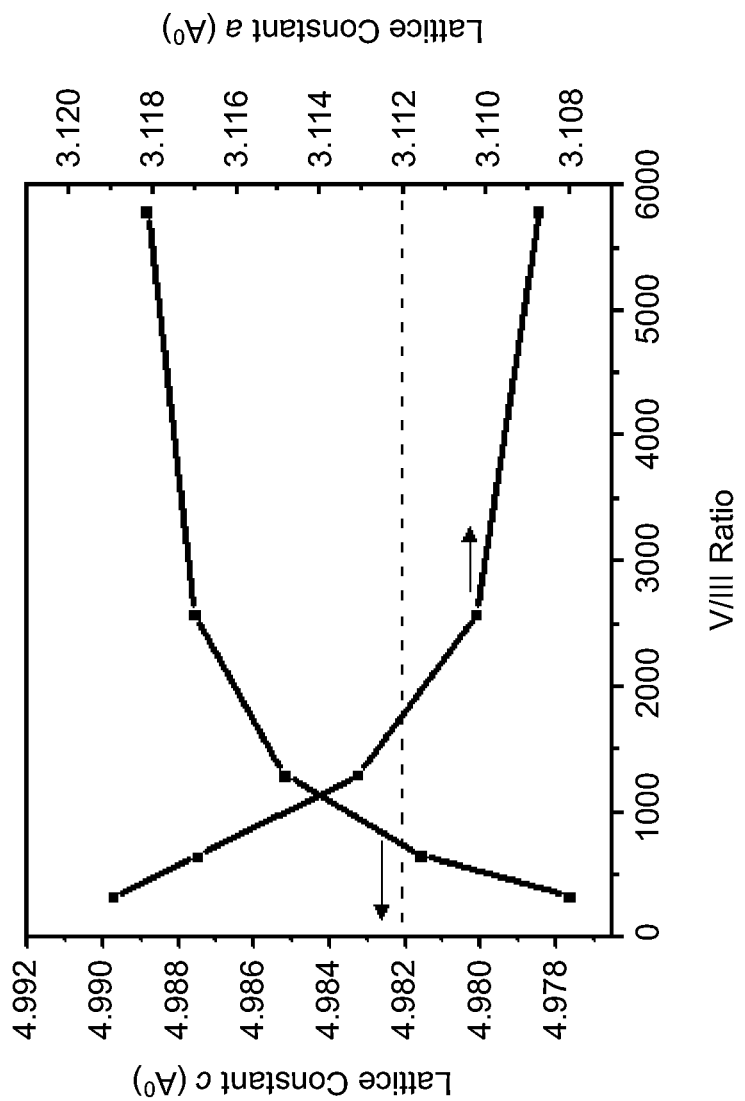
FIG. 2 shows illustrative plots of the lattice constants a and c as a function of the V/III ratio for a group III nitride layer according to an embodiment.

As indicated above, aspects of the invention provide a light emitting heterostructure including a partially relaxed semiconductor layer. The partially relaxed semiconductor layer can be included as a sublayer of a contact semiconductor layer of the light emitting heterostructure. A dislocation blocking structure also can be included adjacent to the partially relaxed semiconductor layer. The heterostructure can result in fewer defects, such as cracks and threading dislocations, present in a light generating structure of the heterostructure. As used herein, unless otherwise noted, the term "set" means one or more (i.e., at least one) and the phrase "any solution" means any now known or later developed solution. As also used herein, a material/structure is considered to be "reflective" to radiation of a particular wavelength when the material/structure has a reflection coefficient of at least thirty percent for the radiation of the particular wavelength. In a more particular embodiment, a highly reflective material/structure has a reflection coefficient of at least eighty percent. Furthermore, a material/structure is considered to be "transparent" to radiation of a particular wavelength when the material/structure allows a significant amount of the radiation to pass there through. In an embodiment, the transparent structure is formed of a material and has a thickness, which allows at least ten percent of the radiation to pass there through.

Aspects of the invention are directed to the growth of semiconductor layers. In an embodiment, the semiconductor layers are formed of elements selected from the group III-V materials system. In a more particular embodiment, the semiconductor layers are formed of group III nitride materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \le W, X, Y, Z \le 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

The layer(s) grown as described herein can be implemented as part of any type of semiconductor device. In an embodiment, the semiconductor device is an emitting device. In a more particular embodiment, the emitting device is configured to operate as a light emitting diode (LED), such as a conventional or super luminescent LED. Similarly, the emitting device can be configured to operate as a laser, such as a laser diode (LD). In another embodiment, the semiconductor device is configured to operate as a photodetector, photomultiplier, and/or the like. Regardless, electromagnetic radiation emitted or detected by the device can comprise a peak wavelength within any range of wavelengths, including visible light, ultraviolet radiation, deep ultraviolet radiation, infrared light, and/or the like. In a more specific embodiment, the device is a deep ultraviolet light emitting diode (DUV LED). For such a device, the transparency of the semiconductor layers to ultraviolet radiation significantly affects the efficiency with which the device operates. To this extent, stress relieving and/or dislocation stopping layers as described herein can be combined with high transparency layers to improve the overall efficiency of the device, e.g., by reducing dislocations and improving transmittance of the transparent semiconductor layers.

Aspects of the invention utilize an ability to selectively grow a layer exhibiting either tensile or compressive residual stress depending on the deposition conditions. For example, a change in a set of the deposition conditions for growing an aluminum nitride (AlN) epitaxial layer on a foreign substrate can result in the layer exhibiting either tensile or compressive residual stress. In an embodiment, the set of deposition conditions includes a molar ratio of group V precursors to group III precursors (V/III ratio), which can be altered during the growth of a group III-V semiconductor layer. Control of the V/III ratio affects an overall lattice constant of the layer due to incorporation of localized point defects through the layer.

Whether a layer experiences tensile or compressive stress also can depend on the lattice constant of the layer as compared with the lattice constant of each adjacent layer. For example, a first AlN layer with a lattice constant of 3.110 Angstroms grown on a second AlN layer with a lattice constant of 3.108 Angstroms experiences compressive stresses, while the second AlN layer experiences tensile stresses. To this extent, the V/III ratio, or another growth characteristic of a semiconductor layer, may not determine whether or not the layer experiences tensile or compressive stress by itself. In contrast, the growth and/or lattice parameters of adjacent layer(s) may be required to evaluate the stresses present in a given layer.

Unless specified otherwise, a "tensile layer" is a layer experiencing tensile stress, and a "compressive layer" is a layer experiencing compressive stress. Throughout the text, these are also referred to as layers with tensile or compressive stress correspondingly. Additionally, a layer may experience compressive stress at one region (e.g., the bottom) of the layer and tensile stress at another region (e.g., the top) of the layer. In this case, such a layer is referred as a "mixed stress layer." In general, a "mixed stress layer" is a layer where a sign of the stress changes throughout the layer, in different portions of the layer, and/or the like. It is understood that while a target compressive stress is primarily used to describe illustrative aspects of the invention, it is understood that the target stress can be tensile.

Additional aspects of the invention are shown and described with respect to a default AlN layer grown with a V/III ratio of 1750. Such a layer comprises a lattice constant a of approximately 3.112 Angstroms and a lattice constant c of approximately 4.982 Angstroms (Å). To this extent, FIG. 2 shows illustrative plots of the lattice constants a and c as a function of the V/III ratio for a group III nitride layer according to an embodiment. The different lattice constants can result in the layer exerting different tensile and compressive properties when grown adjacent to the default AlN layer. For example, for a group III nitride layer grown using a low V/III ratio (e.g., less than approximately 1750), the lattice constant a for the group III nitride layer is slightly larger than the lattice constant a for the default AlN layer. The difference in the lattice constants a results in the group III nitride layer exerting tensile stresses on the adjacent default AlN layer. For a group III nitride layer grown using a high V/III ratio (e.g., greater than approximately 1750), the lattice constant a for the group III nitride layer is slightly smaller than the lattice constant a for the default AlN layer, which results in compressive stresses being exerted by the group III nitride layer on the adjacent default AlN layer. Similarly, the influence of the V/III ratio on the lattice constant c is illustrated. Only small values of the V/III ratio result in a significant reduction of the lattice constant c.

Figure 3:
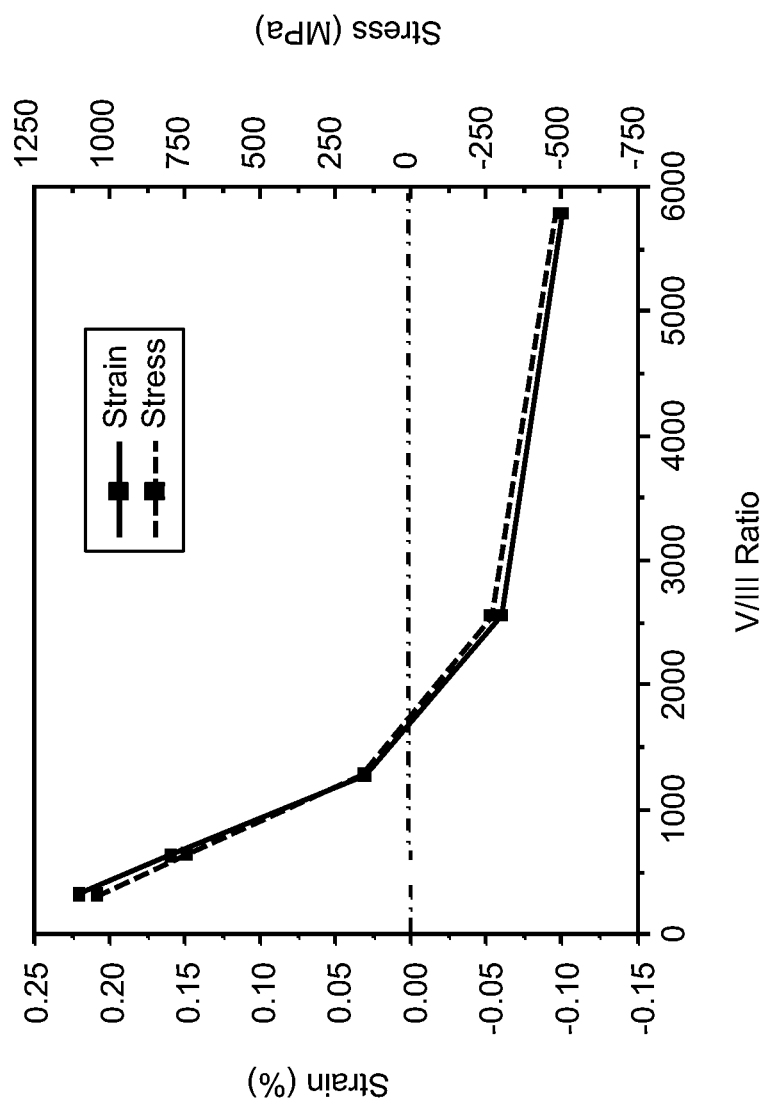
FIG. 3 shows illustrative plots of stress and strain as a function of the V/III ratio for a group III nitride layer according to an embodiment.

FIG. 3 shows illustrative plots of stress and strain as a function of the V/III ratio for a group III nitride layer according to an embodiment. The point of zero strain is chosen to coincide with the default AlN layer having a lattice constant a of 3.112 Å, which is presumed to be adjacent to the group III nitride layer. All the strains and stresses shown in FIG. 3 are calculated relative to this growth condition. As illustrated, the strain and tensile stresses exerted on the default AlN layer by the group III nitride layer reduce as the V/III ratio is increased, eventually switching from tensile to compressive stress. To this extent, a group III nitride layer grown adjacent to the default AlN layer under a low V/III ratio (e.g., less than approximately 1750) is in compressive stress, while an group III nitride layer grown adjacent to the default AlN layer with a high V/III ratio (e.g., above approximately 1750) is in tensile stress. As further illustrated, only small changes in the strain of the AlN layer are produced by modulating the V/III ratio.

As used herein, a semiconductor layer is strained when a lattice constant (typically the in plane lattice constant a) for the semiconductor material forming the semiconductor layer differs from a lattice constant for the same semiconductor material that is experiencing no compressive, tensile, or shear forces. Strain values can be as little as a few hundredth of a percent and already produce high stresses in the semiconductor layer. The unstrained semiconductor material is defined as fully relaxed. Typically, semiconductor layers are epitaxially grown over a substrate or over other semiconductor layers, which may or may not have the same lattice constant as the epitaxially grown layer subject to semiconductor layer composition and growth condition. A semiconductor layer is said to be grown pseudomorphically when its lattice constant is the same as the lattice constant of the underlying semiconductor layer. For a semiconductor layer under stress, it can be energetically favorable to develop dislocation(s) that can partially relax the layer and reduce stresses in the layer. The development of dislocations to reduce stresses in the layer is defined as relaxation process. As used herein, a layer is partially relaxed when the stresses in the layer are reduced by a few hundredth of a percent due to relaxation process. It is understood that the relaxation of a semiconductor layer can be continuous throughout the layer. For example, the layer may not be relaxed at one side and partially relaxed at the other side due to presence of dislocations in the layer. In this case, the lattice constant may change through the layer thickness. Depending on the growth conditions and neighboring layer, the layer can be fully relaxed at one side.

Figure 4:
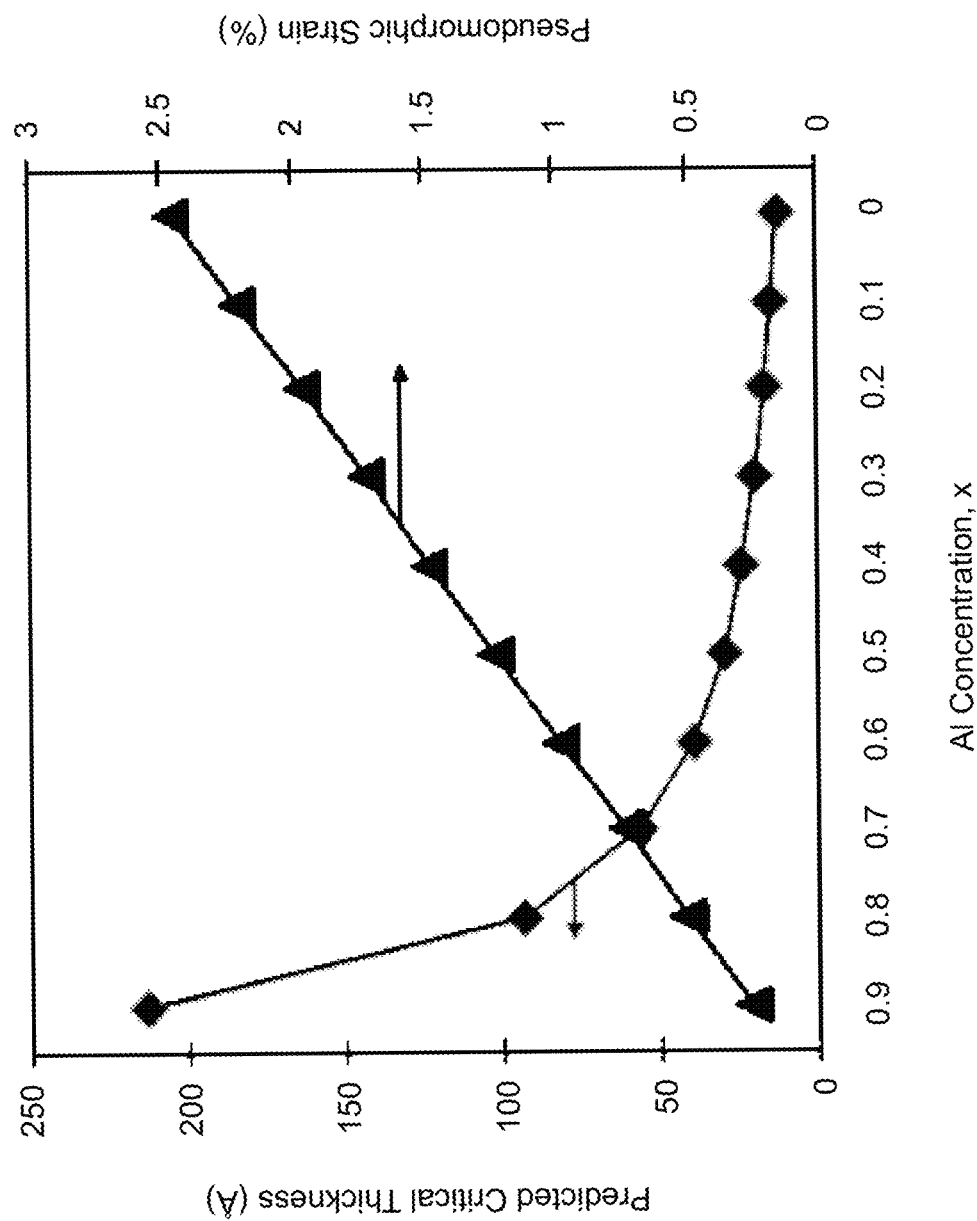
FIG. 4 shows illustrative plots of predicted critical thickness and pseudomorphic strain of a layer grown on an AlN buffer as a function of aluminum concentration in the layer according to the prior art.

Partial relaxation in a semiconductor layer also can be induced when a thickness of the semiconductor layer exceeds a critical thickness where strain relaxation begins through nucleation and/or motion of threading dislocations. In general, a semiconductor film having a large lattice mismatch, where the lattice mismatch is defined as $(a_0-a_e)/a_e$, where $a_0$—is the lattice constant of the underlying semiconductor layer and $a_a$—is the lattice constant of the epitaxially grown layer with an underlying semiconductor layer, will exhibit relaxation at a thickness greater than tens of nanometers. A predicted critical thickness can be calculated using any solution. For example, FIG. 4 shows illustrative plots of predicted critical thickness and pseudomorphic strain of a layer grown on an AlN buffer as a function of aluminum concentration in the layer according to the prior art. The predictions are based on the Matthews-Blakeslee theory, according to which a layer starts to partially relax as a thickness of the layer is increased beyond a critical thickness predicted by the theory. Frequently, the Matthews-Blakeslee theory results in a low estimate, and the relaxation only happens for layers that are substantially thicker than the one predicted by the theory.

Figure 5:
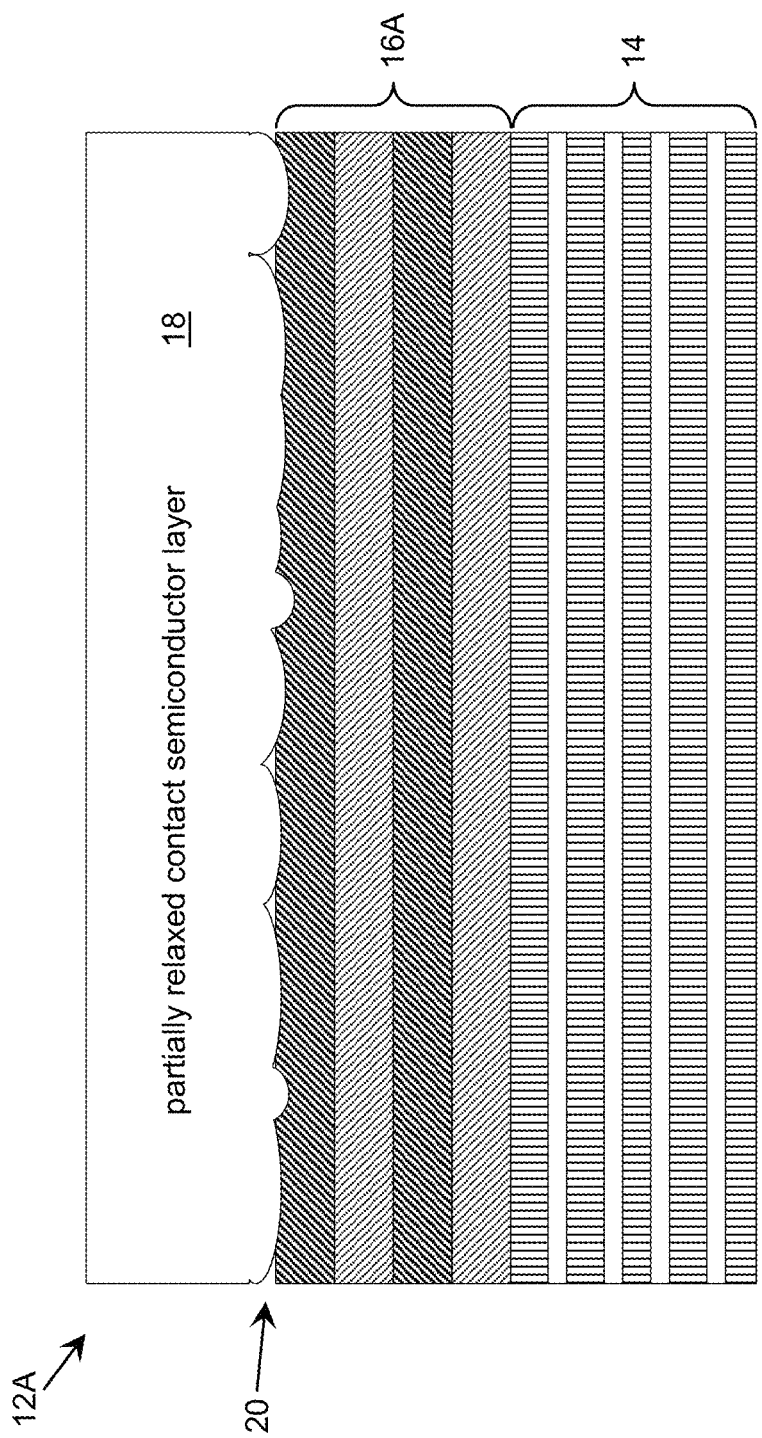
FIG. 5 shows a schematic of an illustrative light emitting heterostructure according to an embodiment.
Figure 6:
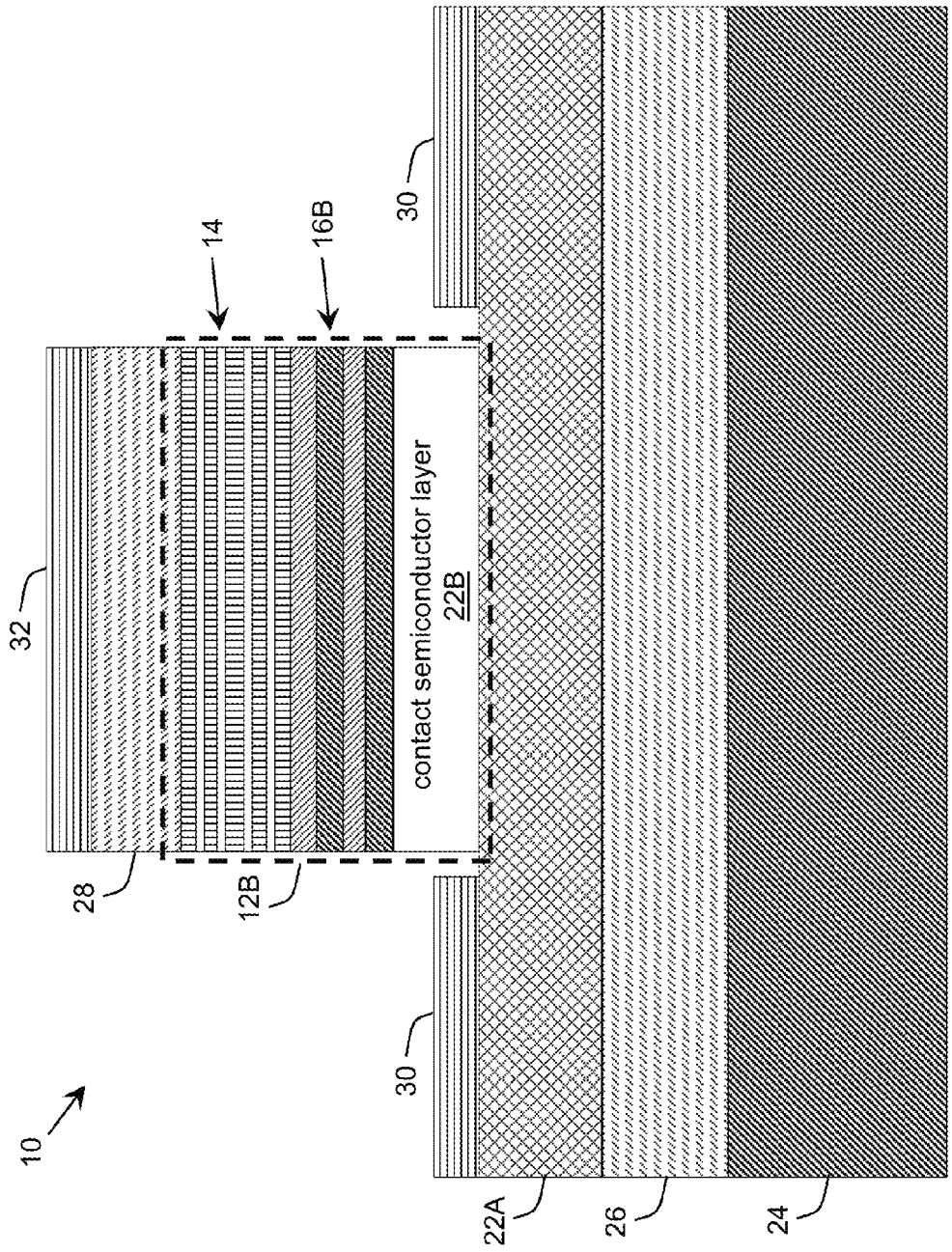
FIG. 6 shows a schematic of an illustrative light emitting device including an alternative light emitting heterostructure according to an embodiment.

FIG. 5 shows a schematic of an illustrative light emitting heterostructure 12A according to an embodiment. The light emitting heterostructure 12A includes a light generating structure 14, an adjacent p-type dislocation blocking structure 16A, and a partially relaxed p-type contact semiconductor layer 18. FIG. 6 shows a schematic of an illustrative light emitting device 10 including an alternative light emitting heterostructure 12B according to an embodiment. In this case, the light emitting heterostructure 12B includes a light generating structure 14, an adjacent n-type dislocation blocking structure 16B, and a n-type contact semiconductor layer 22B. In the light emitting heterostructure 12A, the dislocation blocking structure 16A can be configured to prevent dislocations present in the partially relaxed contact semiconductor layer 18 from propagating into the light generating structure 14. Similarly, in the light emitting heterostructure 12B, the dislocation blocking structure 16B can be configured to prevent dislocations present in the n-type contact semiconductor layer 22B from propagating into the light generating structure 14.

In each case, the light generating structure 14 can be formed using any solution, e.g., a series of alternating quantum wells and barriers. Furthermore, the dislocation blocking structure 16A, 16B can include a plurality of semiconductor layers formed using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer. While not shown for clarity, it is understood that an embodiment can include a light generating structure 14 with both p-type and n-type dislocation blocking structures 16A, 16B located on opposing sides of the light generating structure 14.

Returning to FIG. 5, in an embodiment, the partially relaxed p-type layer 18 is formed using a three-dimensional growth technique, which can facilitate the formation of dislocations, e.g., due to a large lattice mismatch between the material of the partially relaxed p-type contact semiconductor layer 18 and the layers of the dislocation blocking structure 16A. For example, the partially relaxed p-type contact semiconductor layer 18 can be grown using a set of growth conditions that result in an initial formation of islands of the material for the partially relaxed p-type contact semiconductor layer 18 at the interface 20. Illustrative growth conditions to induce formation of the islands include a high growth temperature, a high growth rate, and/or the like. During subsequent growth of the partially relaxed p-type contact semiconductor layer 18, the islands coalesce and form a dislocation rich layer 18 with dislocations present at the island boundaries. Furthermore, the partially relaxed p-type contact semiconductor layer 18 can be grown to a thickness greater than a thickness predicted by the Matthews-Blakeslee theory to further relax the layer 18.

Returning to FIG. 6, the light emitting heterostructure 12B is shown included in a mesa structure, which is located over a structure including a substrate 24 which can be transparent to light, a buffer layer 26, and an n-type layer 22A. Additionally, the mesa structure is shown including a p-type contact semiconductor layer 28 located above the light emitting heterostructure 12B. The device 10 also includes n-type metal contacts 30 to the n-type layer 22A and a p-type metal contact 32 to the p-type contact semiconductor layer 28. Each of the various components of the device 10 can be formed using any solution. In an embodiment, the metal contacts 30, 32 have a reflectivity of at least fifty percent to radiation emitted by the light emitting heterostructure 12B normal to a surface of the metal contact 30, 32. In an embodiment, the p-type contact semiconductor layer 28 is transparent to the radiation emitted by the light emitting heterostructure 12B. It is understood that the light emitting heterostructure 12A (FIG. 5) can be included in a mesa structure of a light emitting device configured similar to the light emitting device 10.

Figure 7:
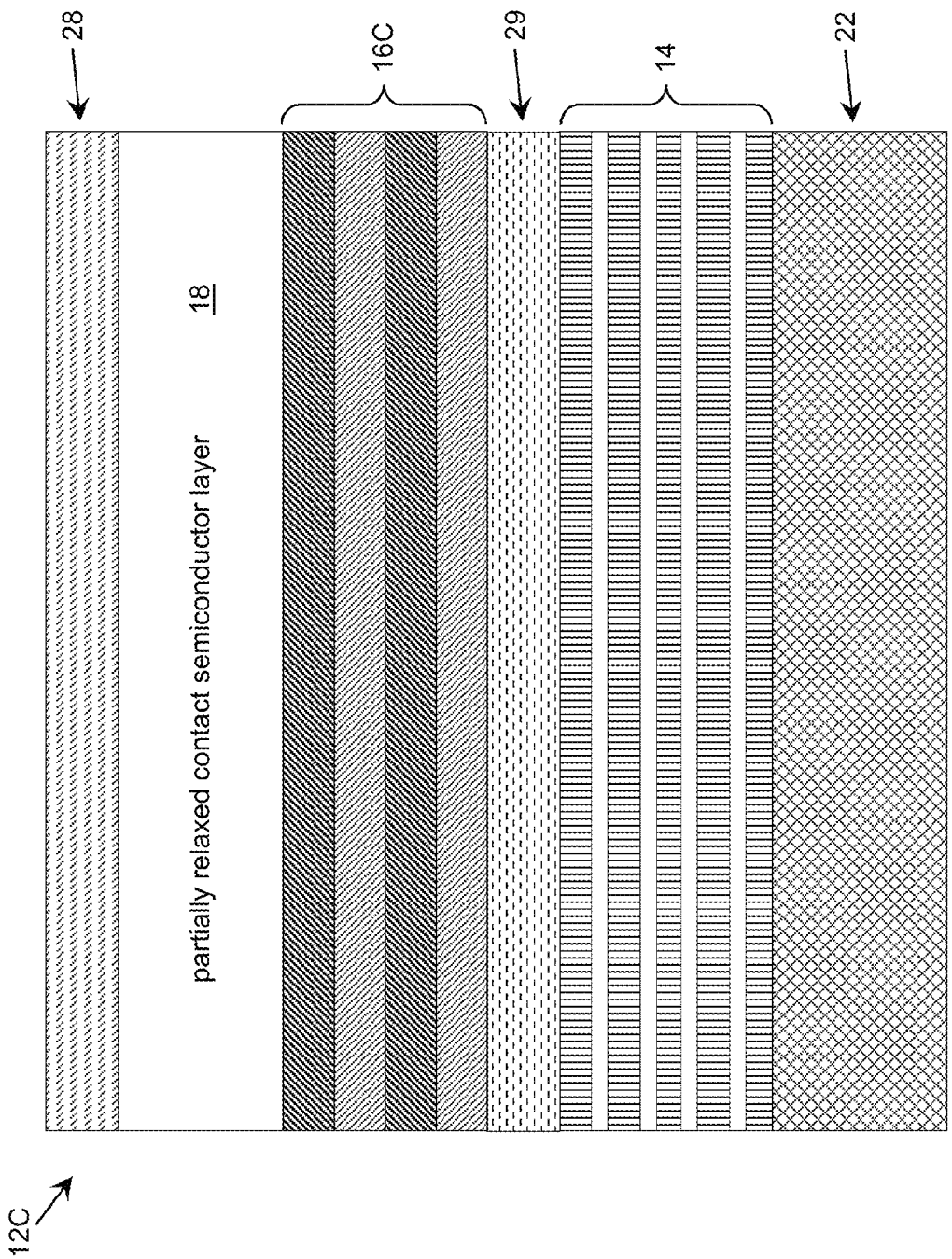
FIG. 7 shows a schematic structure of an illustrative light emitting heterostructure according to an embodiment.

FIG. 7 shows a schematic structure of an illustrative light emitting heterostructure 12C, which can be implemented as a mesa structure of a device 10 (FIG. 6), according to an embodiment. The heterostructure 12C includes an n-type contact semiconductor layer 22 adjacent to a first side of the light generating structure 14 and a p-type contact semiconductor layer 28 located on an opposing side of the light generating structure 14. A partially relaxed p-type contact semiconductor layer 18 and a dislocation blocking structure 16C are shown embedded in the p-type contact semiconductor layer 28. An electron blocking layer 29 is shown immediately adjacent to the light generating structure 14. In an embodiment, these layers are formed using epitaxial growth of semiconductor layers by varying growth conditions of such layers.

As described herein, the dislocation blocking structure includes alternating compressive and tensile layers, which can be obtained by varying the growth mode of the layers and/or the composition of the layers. Furthermore, similar to the partially relaxed contact semiconductor layer 18, one or more of the sublayers of a dislocation blocking structure can be partially relaxed. Partial relaxation can be measured in terms of lattice mismatch of the sublayer and the adjacent semiconductor layer. In a more particular embodiment, the light emitting device 10 and the light emitting heterostructures described herein comprise group III nitride based heterostructures. In this case, the partially relaxed layer 18 can comprise a gallium nitride (GaN) rich semiconductor layer. Partial relaxation of the layer 18 can be obtained via a lattice mismatch of at least a few tenths of a percent between the material of the layer 18 and the underlying layer, such as a top sublayer of an adjacent dislocation stopping layer. In a more particular embodiment, the lattice mismatch is at least one percent. A partially relaxed sublayer of a dislocation blocking structure can be obtained by having an aluminum molar content of the partially relaxed sublayer different from that of the adjacent semiconductor layer.

Additionally, the light generating structure 14 can comprise an active layer of alternating barriers and quantum wells comprising, for instance, an $Al_xGa_{1-x}N$ alloy, with composition of aluminum x in the barriers and quantum wells being selected depending on the target emitting wavelength for the light generating structure 14. For an ultraviolet light emitting device 10, the composition of aluminum in the barrier may be typically around 0.3-0.6 while the composition of aluminum in quantum wells may be typically 0.1-0.5. The electron blocking layer 29 typically can have a large (e.g., above 0.5) fraction of aluminum, whereas the dislocation blocking structure 16C can have a substantially lower aluminum molar fraction of about 0.3. Furthermore, in an embodiment, the dislocation blocking structure 16C can have a graded composition of aluminum with the molar fraction changing from the one of the electron blocking layer 29 to the one of the p-type partially relaxed layer 18. The n-type contact semiconductor layer 22 typically can have an aluminum molar fraction in the range of 0.3-0.6, depending on the requirements for the wavelength emitted by the device 10.

The substrate 24 can comprise any type of substrate 24. In an embodiment, the substrate is an insulating material, such as sapphire or silicon carbide (SiC). However, the substrate can comprise any suitable material, such as silicon (Si), a nitride substrate (e.g., AlN, GaN, BN, AlGaN, and/or the like), an oxide substrate (e.g., aluminum oxynitride, zinc oxide (ZnO), lithium gallate ($LiGaO_2$), lithium aluminate ($LiAlO_2$), magnesium aluminate ($MgAl_2O_4$), scandium magnesium aluminum oxide ($ScMgAlO_4$), and/or the like), and/or other related materials. The buffer layer 26 can provide a transition to accommodate a large lattice mismatch between the substrate 12 and the subsequent semiconductor layers. In an embodiment, the buffer layer 26 can comprise an $Al_xGa_{1-x}N/Al_yGa_{1-y}N$ superlattice, where $0 \le x, y \le 1$. Each superlattice layer can be, for example, up to several nanometers thick. In an embodiment, the layers with differing aluminum content (e.g., denoted by x and y) can have similar thicknesses. In an illustrative embodiment, the buffer layer 26 has a thickness in a range from nearly zero nanometers to approximately 2000 nanometers. In another embodiment, growth of the buffer layer 26 uses a growth temperature between approximately 500 and approximately 1200 degrees Celsius and a growth rate between approximately 0.01 micrometers and approximately 10 micrometers per hour.

As described herein, the dislocation blocking structures 16A, 16B can be configured to prevent the propagation of dislocations into the light generating structure 14. To this extent, FIG. 8 shows a schematic illustration of the dislocation blocking according to an embodiment. In particular, the dislocation blocking structure 16A is shown located between the p-type contact semiconductor layer 18 and the light generating structure 14, which is located directly above an n-type contact semiconductor layer 22. As illustrated, the p-type contact semiconductor layer 18 can include various dislocations, e.g., as a result of lattice mismatch and/or a growth process utilized as described herein. However, the dislocation blocking structure 16A causes these dislocations to turn and annihilate and/or propagate to an edge prior to reaching the light generating structure 14 due to a dislocation bending mechanism of the dislocation blocking structure 16A.

Figures 9A, 9B:
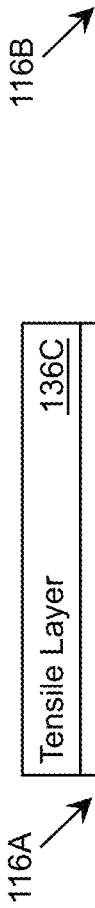
FIGS. 9A and 9B show schematics of illustrative dislocation blocking structures according to embodiments.

FIGS. 9A and 9B show schematics of illustrative dislocation blocking structures 116A, 116B according to embodiments. Each dislocation blocking structure 116A, 116B is formed of a plurality of compressive layers 134A-134C alternating with a plurality of tensile layers 136A-136C. In the structure 116A, a compressive layer 134A is first grown, while in the structure 116B, a tensile layer 136A is first grown. While each dislocation blocking structure 116A, 116B is shown including three periods of epitaxial growth (e.g., each period including a compressive and a tensile layer), it is understood that a dislocation blocking structure can include any number of periods. In an embodiment, the stress changes abruptly between a compressive layer and the adjacent tensile layer. Alternatively, the stress can gradually change between adjacent layers (e.g., by growing layers having a graded tensile or compressive stress). Furthermore, the tensile and compressive stresses can be substantially constant between periods of the dislocation blocking structures 116A, 116B or can gradually change from period to period.

The growth of a dislocation blocking structure 116A, 116B, and the growth of the corresponding layers 134A-134C, 136A-136C forming the dislocation blocking structure 116A, 116B, can use any set of deposition conditions. For example, the set of deposition conditions for a layer 134A-134C, 136A-136C can include: a group III precursor flow rate between approximately 0.1 and approximately 200 micromoles per minute; a nitrogen precursor flow rate between approximately 100 and 10000 standard cubic centimeters per minute (SCCM); a pressure between approximately 1 and 760 Torr; a molar ratio of group V precursors to group III precursors (V/III ratio) between approximately 10 and approximately 1000; and a growth temperature between approximately 500 and approximately 1800 degrees Celsius. Furthermore, a layer 134A-134C, 136A-136C can be grown to a thickness that is greater than a critical thickness to avoid pseudomorphic growth. In an embodiment, each layer 134A-134C, 136A-136C has a thickness between approximately one nanometer and five micrometers.

As described herein, during the growth of a dislocation blocking structure 116A, 116B, one or more of a set of the deposition conditions for epitaxially growing a layer 134A-134C, 136A-136C can be changed to cause the resulting layer 134A-134C, 136A-136C to exhibit either tensile or compressive residual stress. For example, the growth of a compressive layer and the growth of a tensile layer can use molar ratios of group V precursors to group III precursors that differ by at least ten percent. In an embodiment, a composition of the compressive layer differs from a composition of the tensile layer by no more than approximately five percent. For example, a fraction of aluminum in the tensile layer can differ from a fraction of aluminum in the compressive layer by no more than approximately five percent. Similarly, the compressive and tensile layers can have a lattice mismatch of at least 0.01% (e.g., the lattice constant of one layer can be different from the lattice constant of another layer by at least 0.0001 Angstroms). Furthermore, a growth rate for the compressive and tensile layers can be changed. In an embodiment, the growth rates for the compressive and tensile layers differ by at least ten percent. A growth temperature for the compressive and tensile layers can be substantially the same or changed. In an embodiment, the growth temperatures for the compressive and tensile layers differ by at least two percent.

In an embodiment, a surface of one or more layers can be patterned, which can be configured to provide an additional relaxation mechanism for reducing cracks and/or threading dislocations in a structure. For example, a surface of the substrate 24 (FIG. 6) and/or the buffer layer 26 (FIG. 6) can be patterned, e.g., using etching, masking, a combination of etching and masking, and/or the like. A layer, such as the buffer layer 26 and/or any layer located above the buffer layer, can be grown in multiple steps, one or more of which can include patterning. Such patterning can be achieved by etching and/or masking the layer, masking and subsequent overgrowth, by producing voids during overgrowth process, and/or the like. Regardless, the patterning can be configured to reduce an overall stress accumulated in the corresponding layer structure.

Figure 10A:
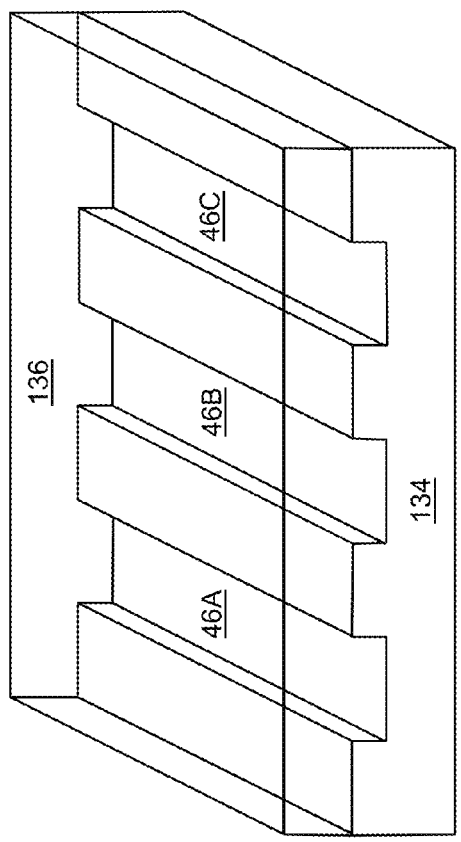
FIGS. 10A and 10B show illustrative patterns of a surface of a compressive layer with a tensile layer grown thereon according to embodiments.
Figure 10B:
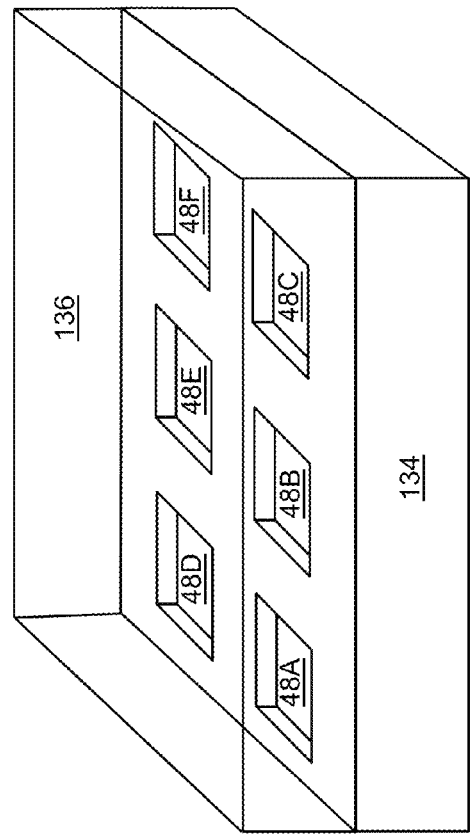

Furthermore, one or more of the various layers in a dislocation blocking structure described herein can be patterned. For example, FIGS. 10A and 10B show illustrative patterns of a surface of a compressive layer 134 with a tensile layer 136 grown thereon according to embodiments. In FIG. 10A, the surface of the compressive layer 134 is patterned with a plurality of stripes 46A-46C, while in FIG. 10B, the surface of the compressive layer 134 is patterned with a plurality of windows 48A-48F. However, it is understood that the stripe/window patterns are only illustrative of various patterns that can be utilized. Furthermore, it is understood that similar patterns can be formed on a surface of a substrate 24 (FIG. 6), a buffer layer 26 (FIG. 6), and/or a tensile layer 136 prior to the growth of a subsequent layer thereon. Regardless, each pattern can produce an interface where the layers 134, 136 have a common boundary in both a vertical direction of growth and in a lateral direction of the layer.

Figure 11A:
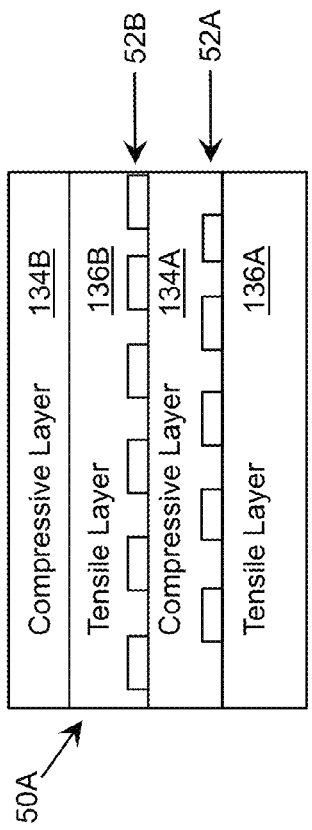
FIGS. 11A and 11B show illustrative patterning arrangements according to embodiments.
Figure 11B:
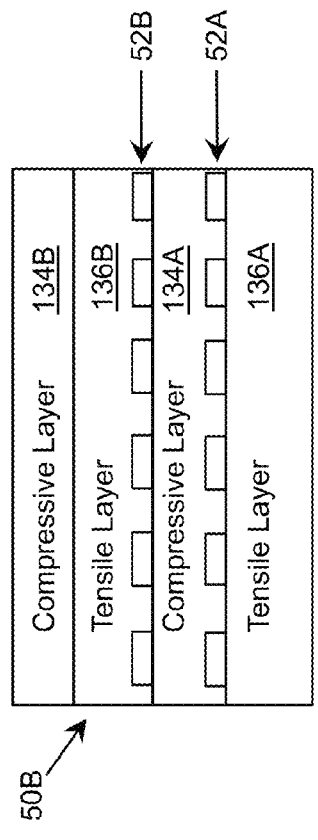

When patterning is employed on the surfaces of multiple layers, the relative positioning of the patterning elements and/or the patterns can be varied for the surfaces of adjacent patterned layers. For example, FIGS. 11A and 11B show illustrative patterning arrangements according to embodiments. In FIGS. 11A and 11B, an interface between a tensile layer 136A and a compressive layer 134A has a first pattern 52A, and an interface between the compressive layer 134A and a tensile layer 136B has a second pattern 52B. The patterns 52A, 52B can be formed by a plurality of patterning elements, for example, a series of masked domains or voids located at the respective interfaces. However, in the structure 50A, the patterning elements of the patterns 52A, 52B are laterally offset from one another, thereby forming a vertical checkerboard-like formation of the patterning elements. In contrast, in the structure 50B, the patterning elements of the patterns 52A, 52B are positioned at substantially the same lateral locations.

As described herein, a dislocation blocking structure can include one or more partially relaxed sublayers, which can be obtained by having a lattice mismatch of at least one percent between the partially relaxed sublayer and an adjacent semiconductor layer. FIGS. 12A and 12B illustrate lattice mismatch between two lattices according to an embodiment. FIG. 12A shows relaxed lattices, where lattice L1A is an aluminum rich lattice and lattice L2A is a gallium nitride rich lattice. Two lattice mismatched materials can be pseudomorphically grown such that the resulting layers have the same lattice constant. To this extent, FIG. 12B shows pseudomorphically grown lattices L1B, L2B, where the lattices L1B, L2B exhibit stress onto each other. The resulting lattice constant of the pseudomorphically grown lattices L1B, L2B, referred to herein as the effective lattice constant, is different from the lattice constants for the relaxed lattices L1A, L2A shown in FIG. 12A. As a result, each sublayer is under tensile or compressive stress.

Figure 13:
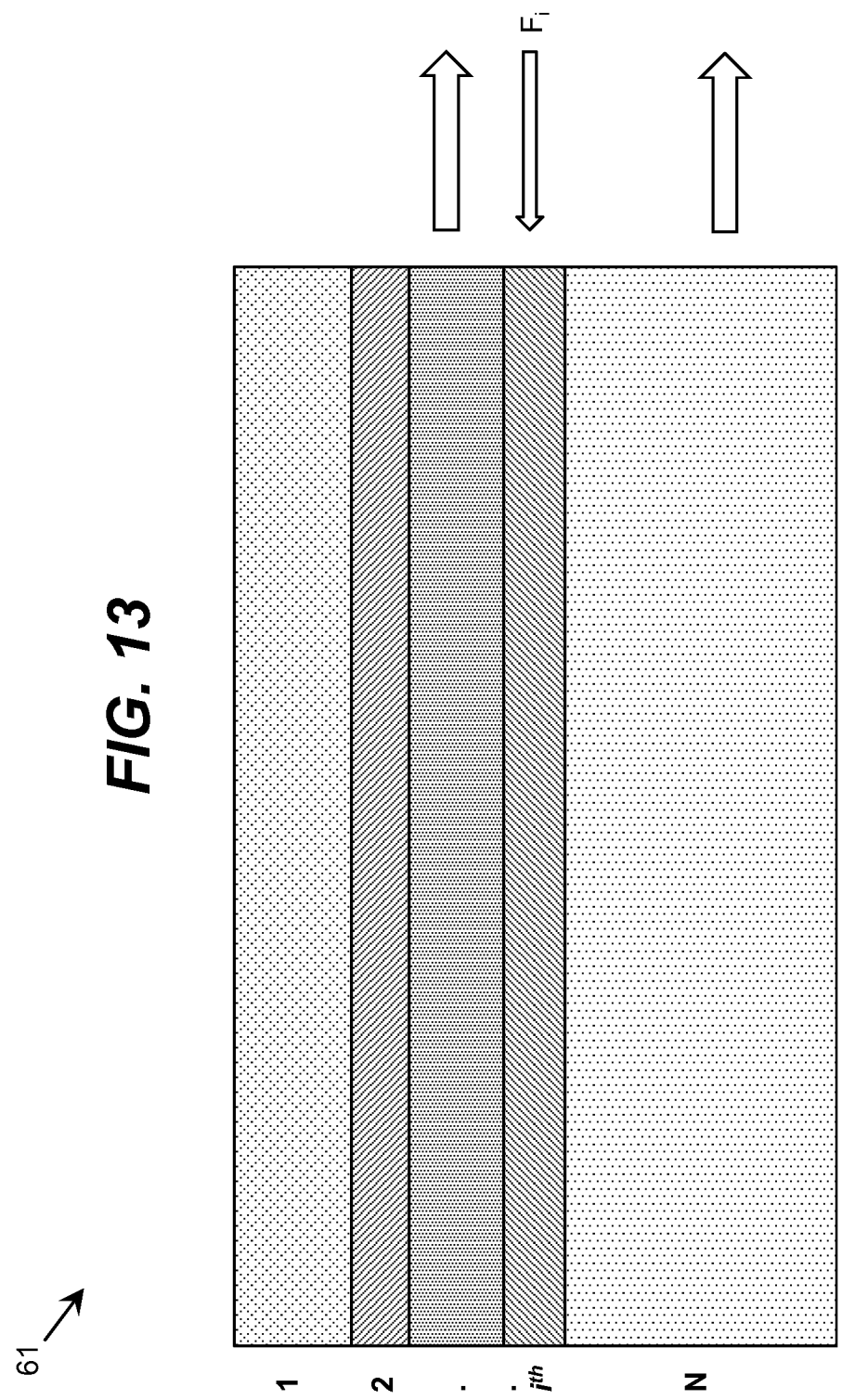
FIG. 13 shows an illustrative structure including N pseudomorphically grown semiconductor layers having different lattice constants according to an embodiment.

The effective lattice constant can be estimated from a condition of zero total stresses imposed on the system of layers. For example, FIG. 13 shows an illustrative structure 61 including N pseudomorphically grown semiconductor layers having different lattice constants according to an embodiment. In this case, the effective lattice constant can be calculated from a condition that all forces across any cross plane must cancel, thus $\Sigma_i F_i = 0$, where $F_i = \sigma_i h_i W$, W is a width of the layer (as measured into the page), $h_i$ is the height of the layer, and a is the biaxial stress. The biaxial stress can be calculated as $\sigma_i = M_i \epsilon_i$, $M_i = E_i/(1-v_i)$, where $E_i$ is the Young's modulus of the $i^{th}$ layer, $v_i$ is the Poisson ratio of the $i^{th}$ layer, and $\epsilon_i$ is the strain of the $i^{th}$ layer. Using the balance of forces, $\Sigma_i F_i = 0$:

$$\sum_i \frac{M_i h_i (a_e - a_i)}{a_i} = 0 \rightarrow a_e = \frac{\sum_i M_i h_i}{\sum_i \frac{M_i h_i}{a_i}},$$

where $a_e$ is an effective lattice constant of the system of layers.

Figure 14:
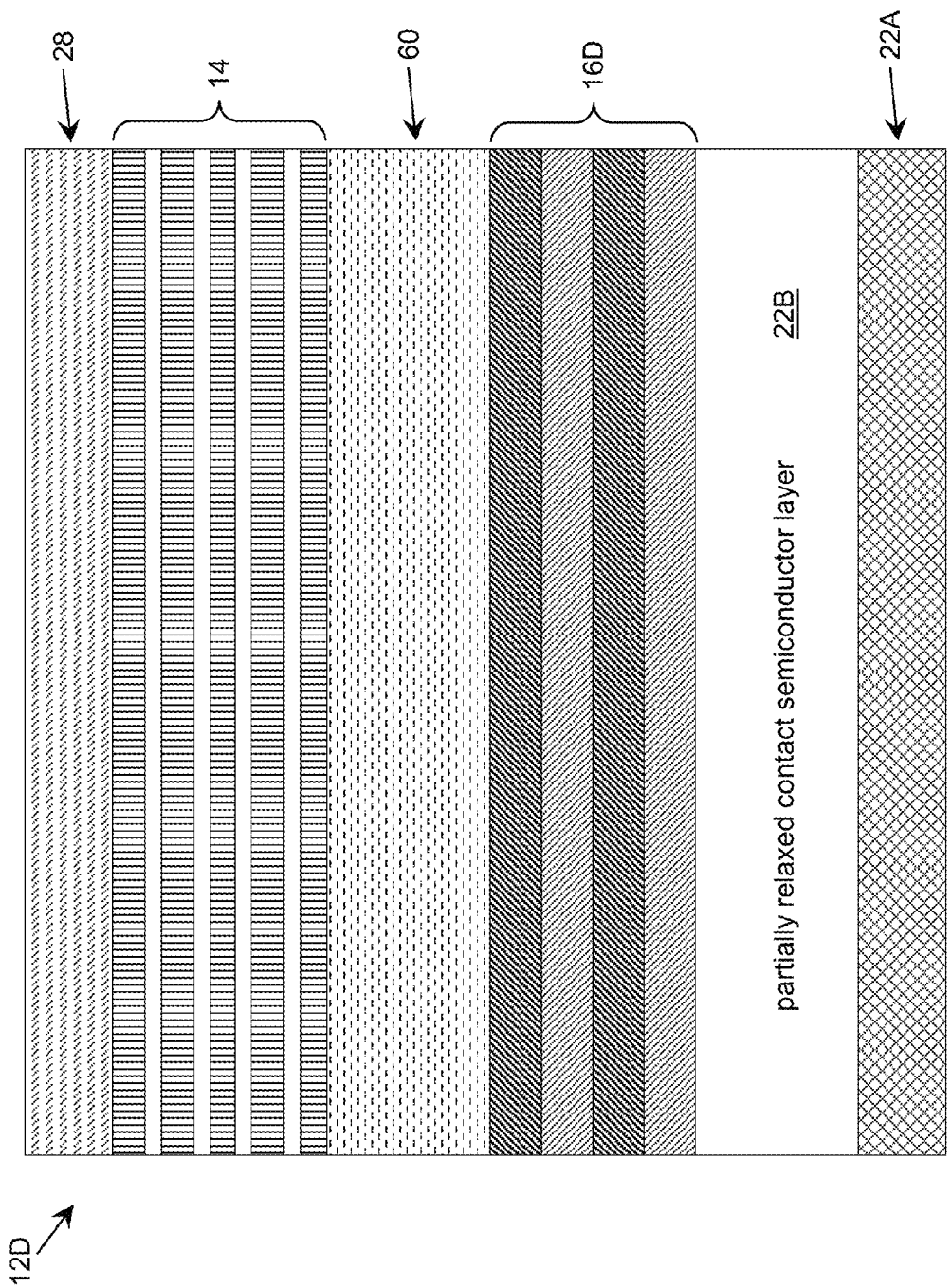
FIG. 14 shows a schematic structure of an illustrative light emitting heterostructure according to an embodiment.

FIG. 14 shows a schematic structure of an illustrative light emitting heterostructure 12D, which can be implemented as a mesa structure in a device 10 (FIG. 4), according to an embodiment. In this case, the heterostructure 12D includes a dislocation blocking structure 16D and a partially relaxed n-type contact semiconductor layer 22B embedded within the n-type contact semiconductor layer 22A. In an embodiment, a structure of the dislocation blocking structure 16D is selected such that the corresponding effective lattice constant for the dislocation blocking structure 16D corresponds to the effective lattice constant of the light generating structure 14 to within a few tenths of a percent. In a more particular embodiment, a thickness and/or composition of the sublayers of the dislocation blocking structure 16D are adjusted to correspond to the effective lattice constant of the light generating structure 14 to within a few tenths of a percent.

Additionally, the light generating heterostructure 12D is shown including a graded layer 60 located between the dislocation blocking structure 16D and the light generating structure 14. The graded layer 60 can be configured to further reduce stresses in the light generating structure 14. For example, the graded layer 60 can comprise a composition that varies from a composition of an adjacent layer, such as the dislocation blocking structure 16D, located on one side, to a composition of the light generating structure 14 located on the opposing side. The composition grading can be linear or parabolic, with a grading gradient selected to minimize stresses and/or maximize polarization doping. While the graded layer 60 is shown implemented on the n-type side of the light generating structure 14, it is understood that a graded layer can be included on the p-type side of the light generating structure 14.

By combining variations of V/III ratio among layers and variations in compositions, heterostructures can be grown without changing the lattice constant. For example, by adjusting the V/III ratio and/or growth temperature, an AlN lattice constant can be varied between 3.108 Å and 3.118 Å. Additionally, an AlGaN layer having an Al content of 90% (e.g., $Al_{0.9}Ga_{0.1}N$) can have a relaxed lattice constant of 3.12 Å, which can be adjusted by adjusting the V/III ratio to between 3.115 Å and 3.125 Å. As a result, an $Al_{0.9}Ga_{0.1}N$/AlN heterostructure having the same effective lattice constant (e.g., between 3.115 Å and 3.118 Å) but different composition can be formed. Furthermore, the AlGaN lattice constant can be graded before deposition of a next AlGaN layer having a lower aluminum content, etc. In general, the V/III ratio can be utilized to lower a gradient of the lattice constant at a heterojunction or a graded junction as compared to a gradient lattice constant that would otherwise be obtained without utilizing variations in the V/III ratio during the epitaxial growth. As used herein, a graded junction refers to any graded layer that is inserted between two layers of different composition where the composition of the graded layer transitions from the first layer to the second layer.

It is understood that a device or a heterostructure used in forming a device including a structure described herein can be fabricated using any solution. For example, a device/heterostructure can be manufactured by obtaining (e.g., forming, preparing, acquiring, and/or the like) a substrate 24 (FIG. 6), forming (e.g., growing) a buffer layer 26 (FIG. 6) thereon, and growing a semiconductor heterostructure on the buffer layer 26 as described herein. Furthermore, the fabrication can include patterning a surface of the substrate 24, the buffer layer 26, and/or a semiconductor layer as described herein, the deposition and removal of a temporary layer, such as mask layer, the formation of one or more additional layers not shown, and/or the like. Additionally, one or more metal layers, contacts, and/or the like can be formed using any solution. The heterostructure/device also can be attached to a submount via contact pads using any solution. The fabrication of a device or a heterostructure can include one or more of various additional acts. For example, the fabrication can include removal of the foreign substrate and/or one or more of the layers after growth of a heterostructure.

The patterning of a layer can be performed using any solution. For example, the patterning can include defining a set of regions on a top surface of the layer for etching using, for example, photolithography to apply a photoresist defining the set of regions, or the like. The set of openings having a desired pattern can be formed, e.g., by etching in the set of defined regions of the layer. Subsequently, the photoresist can be removed from the surface. Such a process can be repeated one or more times to form a complete pattern on the layer. The patterning of a layer also can include applying (e.g., depositing) a mask (e.g., silicon dioxide, a carbon based material, or the like) over a second set of regions on the top surface of the layer. When the pattern also includes a set of openings, the second set of regions can be entirely distinct from the locations of the set of openings. Furthermore, as described herein, the formation of a layer can include multiple repetitions of the patterning process. In this case, each repetition can vary from the previous repetition in one or more aspects. For example, a repetition can include both applying a mask and forming openings on a surface, only forming openings, only applying a mask, and/or the like. Additionally, as described herein, the locations of the masked and/or opening portions for a repetition can be vertically offset from the locations of the adjacent repetition.

Figure 15:
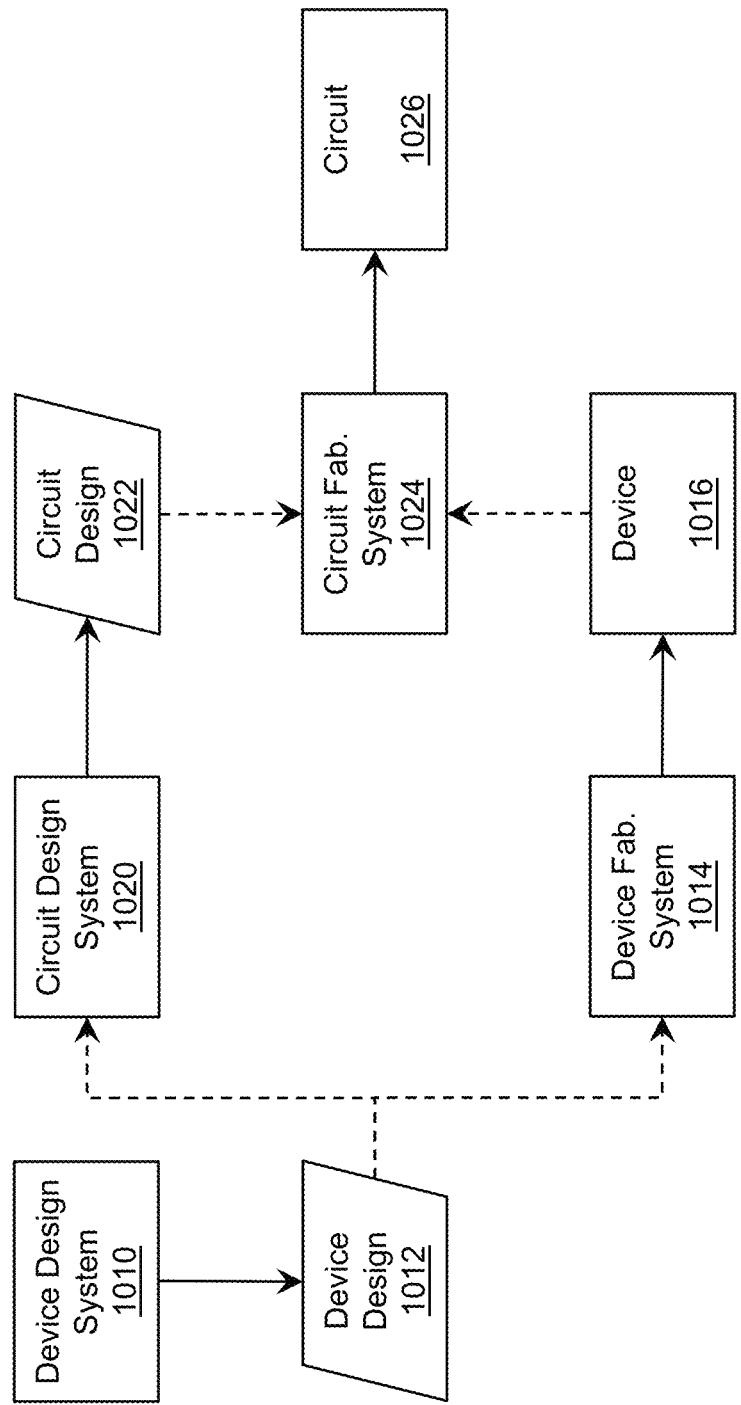
FIG. 15 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 15 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A heterostructure comprising:
a light generating structure having a first side and a second side;
a n-type contact semiconductor layer located on the first side of the light generating structure;
a p-type contact semiconductor layer located on the second side of the light generating structure, wherein at least one of the contact semiconductor layers includes an embedded partially relaxed sublayer; and
a dislocation blocking structure located between the partially relaxed sublayer and the light generating structure, wherein the dislocation blocking structure includes a graded composition that changes from a first side of the dislocation blocking structure to a second side thereof.

2. The heterostructure of claim 1, wherein the dislocation blocking structure includes a plurality of tensile sublayers alternating with a plurality of compressive sublayers.

3. The heterostructure of claim 2, wherein the heterostructure is formed of group III-V materials, and wherein the alternating tensile and compressive sublayers have the same effective lattice constant and are formed by varying at least one of: an aluminum composition or a V/III ratio, of adjacent sublayers in the dislocation blocking structure.

4. The heterostructure of claim 3, wherein the effective lattice constant corresponds to an effective lattice constant of the light generating structure.

5. The heterostructure of claim 1, further comprising:
a substrate transparent to light generated by the light generating structure; and
a buffer layer adjacent to the substrate, wherein at least one of: the n-type contact semiconductor layer or the p-type contact semiconductor layer is located between the light generating structure and the buffer layer.

6. The heterostructure of claim 1, wherein the partially relaxed sublayer has a lattice mismatch of at least one percent with an immediately adjacent semiconductor layer.

7. The heterostructure of claim 1, wherein the heterostructure is formed of group III-V materials, and wherein the lattice mismatch is obtained by a change in an aluminum molar content of the partially relaxed sublayer.

8. The heterostructure of claim 1, wherein a thickness of the partially relaxed sublayer is greater than a predicted critical thickness corresponding to partial relaxation.

9. The heterostructure of claim 1, further comprising a graded layer located immediately adjacent to one of the first or second sides of the light generating structure.

10. A device comprising:
a mesa structure including:
a light generating structure having a first side and a second side;
a n-type contact semiconductor layer located on the first side of the light generating structure;

a p-type contact semiconductor layer located on the second side of the light generating structure, wherein at least one of the contact semiconductor layers includes an embedded partially relaxed sublayer; and wherein the at least one of the contact semiconductor layers further includes a dislocation blocking structure located between the partially relaxed sublayer and the light generating structure, and wherein the dislocation blocking structure includes a graded composition that changes from a first side of the dislocation blocking structure to a second side thereof.

11. The device of claim 10, further comprising:

a substrate transparent to light generated by the light generating structure; and a buffer layer adjacent to the substrate, wherein at least one of: the n-type contact semiconductor layer or the p-type contact semiconductor layer is located between the light generating structure and the buffer layer.

12. The device of claim 10, wherein the dislocation blocking structure includes a plurality of tensile sublayers alternating with a plurality of compressive sublayers.

13. The device of claim 12, wherein an effective lattice constant of the dislocation blocking structure corresponds to an effective lattice constant of the light generating structure.

14. The device of claim 10, wherein a thickness of the partially relaxed sublayer is greater than a predicted critical thickness corresponding to partial relaxation.

15. The device of claim 10, further comprising a graded layer located immediately adjacent to one of the first or second sides of the light generating structure.

16. A method comprising:

forming a heterostructure, the heterostructure comprising:

a light generating structure having a first side and a second side;

an n-type contact semiconductor layer located on the first side of the light generating structure; and a p-type contact semiconductor layer located on the second side of the light generating structure, wherein at least one of the contact semiconductor layers includes an embedded partially relaxed sublayer, wherein the forming includes forming a dislocation blocking structure located between the partially relaxed sublayer and the light generating structure, wherein the dislocation blocking structure includes a graded composition that changes from a first side of the dislocation blocking structure to a second side thereof.

17. The method of claim 16, wherein the dislocation blocking structure includes a plurality of tensile sublayers alternating with a plurality of compressive sublayers.

18. The method of claim 17, wherein the forming the heterostructure includes configuring the dislocation blocking structure such that an effective lattice constant of the dislocation blocking structure substantially matches an effective lattice constant of the light generating structure.

19. The method of claim 18, wherein the heterostructure is formed of group III-V materials, and wherein the alternating tensile and compressive sublayers have the same effective lattice constant and are formed by varying at least one of: an aluminum composition or a V/III ratio, of adjacent sublayers in the dislocation blocking structure.

20. The method of claim 16, the heterostructure further including a graded layer located immediately adjacent to one of the first or second sides of the light generating structure.

21. The device of claim 10, wherein the mesa structure further includes a p-type metal contact located on the p-type contact semiconductor layer, and wherein the device further includes an n-type metal contact located adjacent to the n-type contact semiconductor layer, wherein the n-type metal contact is separated from the mesa structure without contact thereof.

* * * * *